United States Patent [19]

Okada et al.

[11] Patent Number: 5,949,217

[45] Date of Patent: Sep. 7, 1999

[54] METHOD TO DETERMINE REMAINING CAPACITY OF A RECHARGEABLE BATTERY

[75] Inventors: Tetsuya Okada; Takahiro Yamashita, both of Sumoto, Japan

[73] Assignee: Sanyo Electric Co., Ltd., Osaka, Japan

[21] Appl. No.: 09/015,621

[22] Filed: Jan. 29, 1998

[30] Foreign Application Priority Data

Jan. 30, 1997 [JP] Japan ..................................... 9-016837

[51] Int. Cl.[6] .................................................. H01M 10/44
[52] U.S. Cl. .................................. 320/132; 320/DIG. 21
[58] Field of Search .................................... 320/124, 125, 320/131, 132, 134, 136, DIG. 21; 324/427, 432, 433; 340/635, 636

[56] References Cited

FOREIGN PATENT DOCUMENTS 5-87896   4/1993   Japan .

Primary Examiner—Edward H. Tso
Attorney, Agent, or Firm—Wenderoth, Lind & Ponack, L.L.P.

[57] ABSTRACT

This method to determine remaining capacity of a rechargeable battery calculates remaining battery capacity by subtracting discharge capacity, computed by integrating battery discharge current, from charge capacity. Voltage of the discharging rechargeable battery is measured, and when battery voltage reaches a first voltage and a lower second voltage, the computed remaining battery capacity is corrected according to a previously established first remaining battery capacity and second remaining battery capacity corresponding to those voltages. The difference between calculated remaining battery capacity or discharge capacity at the first and second voltages is compared to the difference between the previously established first and second remaining battery capacity values, and the first voltage is modified to make those two differences equal.

10 Claims, 2 Drawing Sheets

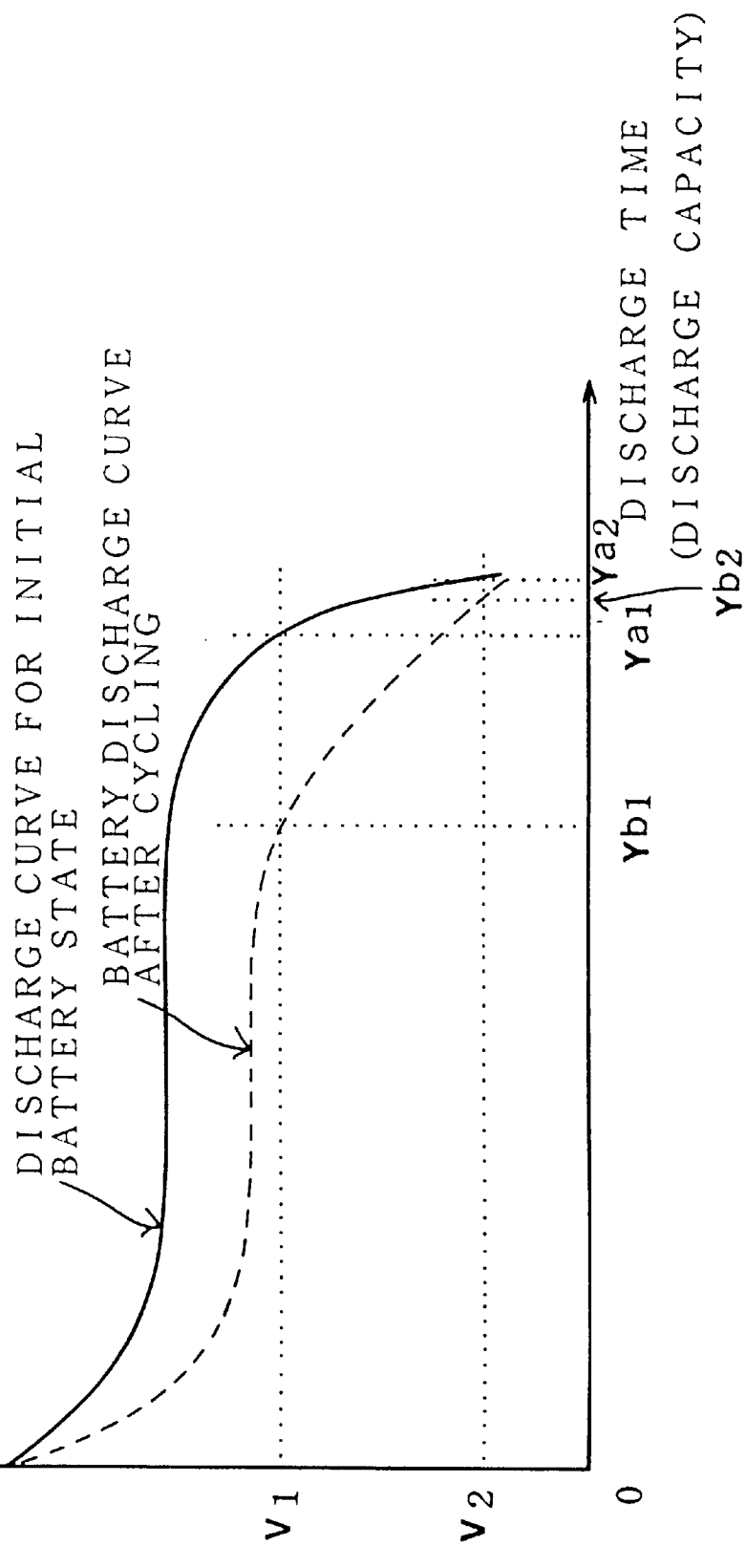

METHOD TO DETERMINE REMAINING CAPACITY OF A RECHARGEABLE BATTERY

BACKGROUND OF THE INVENTION

This invention is a method to determine remaining battery capacity of a rechargeable battery, and in particular it relates to a method to determine remaining battery capacity by correcting the computed battery capacity to determine an accurate remaining battery capacity.

In portable electronic equipment such as notebook personal computers and portable telephones, rechargeable batteries are used as the power source. For these applications, the remaining battery capacity of the rechargeable batteries is determined and displayed to prevent sudden loss of power, possible data loss, and inability to use the equipment.

This remaining battery capacity is normally determined by integrating battery discharge current and subtracting the integrated value from the rechargeable battery charge capacity. However, error develops between the remaining battery capacity determined by this method and the actual remaining battery capacity. The error results from rechargeable battery degradation and changes in charge capacity due to variation in the operating environment.

The technology to compensate for this error and display an accurate remaining battery capacity is disclosed in Japanese Non-examined Patent Publication No. 5-87896 issued Apr. 6, 1993. In this disclosure, techniques are cited to correct the remaining battery capacity determined from integrated discharge current to find an accurate remaining battery capacity based on previously established actual remaining rechargeable battery capacity corresponding to a plurality of specified voltages such as the fully charged battery voltage, the low battery voltage, and the dead battery voltage.

However, even with this type of compensation, inability to obtain an accurate remaining battery capacity is possible. FIG. 2 is a graph showing rechargeable battery (specifically, nickel cadmium rechargeable battery) voltage change during discharge. The solid line in FIG. 2 is the discharge curve for the rechargeable battery in its initial state, and the broken line is the discharge curve of the rechargeable battery after a specified number of discharge cycles.

Clearly from this graph, the rechargeable battery discharge curve drops as the number of discharge cycles progresses. Consequently, when the measured remaining battery capacity is corrected by a previously established remaining battery capacity corresponding to a specified voltage (for example, the first voltage V1 in FIG. 2), a large disparity develops as the number of discharge cycles progresses.

Specifically, the remaining battery capacity at the point where the battery voltage of the rechargeable battery represented by the broken line discharge curve reaches the first voltage V1 is clearly greater than the remaining battery capacity of the rechargeable battery represented by the solid line at voltage V1. Regardless of this, the remaining battery capacity of the battery represented by the broken line discharge curve is corrected to the previously established remaining battery capacity (solid line discharge curve) corresponding to the first voltage V1. Therefore, a remaining battery capacity which is less than the actual remaining battery capacity results. The present invention was developed to overcome this type of shortcoming, and an object of the present invention is to provide a method which can always accurately determine remaining battery capacity of a rechargeable battery.

The above and further objects and features of the invention will more fully be apparent from the following detailed description with accompanying drawings.

SUMMARY OF THE INVENTION

The method to determine remaining capacity of a rechargeable battery in the present invention integrates rechargeable battery discharge current to compute discharge capacity (the quantity of charge discharged from the battery). This computed discharge capacity is subtracted from the rechargeable battery charge capacity to find remaining battery capacity. Meanwhile, rechargeable battery voltage is measured, and when a first voltage and a lower second voltage are reached, the computed remaining battery capacity values at those voltages are revised by previously established first and second remaining battery capacity values corresponding to those respective voltages. In this manner, the error between the remaining battery capacity value computed at the end of battery discharge and the actual remaining battery capacity is corrected.

Further, the difference between the computed remaining battery capacity values (or discharge capacity values) at the first and second voltages and the difference between the previously established first and second remaining battery capacity values are compared, and the first voltage is adjusted to make those two differences equal.

The present invention is provided with a step to integrate rechargeable battery discharge current, a step to compute remaining battery capacity by subtracting the integrated discharge current from the rechargeable battery charge capacity, a step to measure rechargeable battery voltage, a step to revise the computed remaining battery capacity values at the first and lower second voltages to the previously established first and second remaining battery capacity values corresponding to those respective voltages, a step to compare the difference between the computed remaining battery capacity values at the points where the first and second voltages are reached with the difference between the previously established first and second remaining battery capacity values, and a step to adjust the first voltage to make the two remaining battery capacity differences equal. Provision of these steps enables accurate determination of rechargeable battery remaining battery capacity at all times.

BRIEF DESCRIPTION OF THE DRAWINGS

FIG. 2 is a graph of data showing the correlation between rechargeable battery voltage and discharge time (discharge capacity).

DETAILED DESCRIPTION OF THE INVENTION

Figure 1:
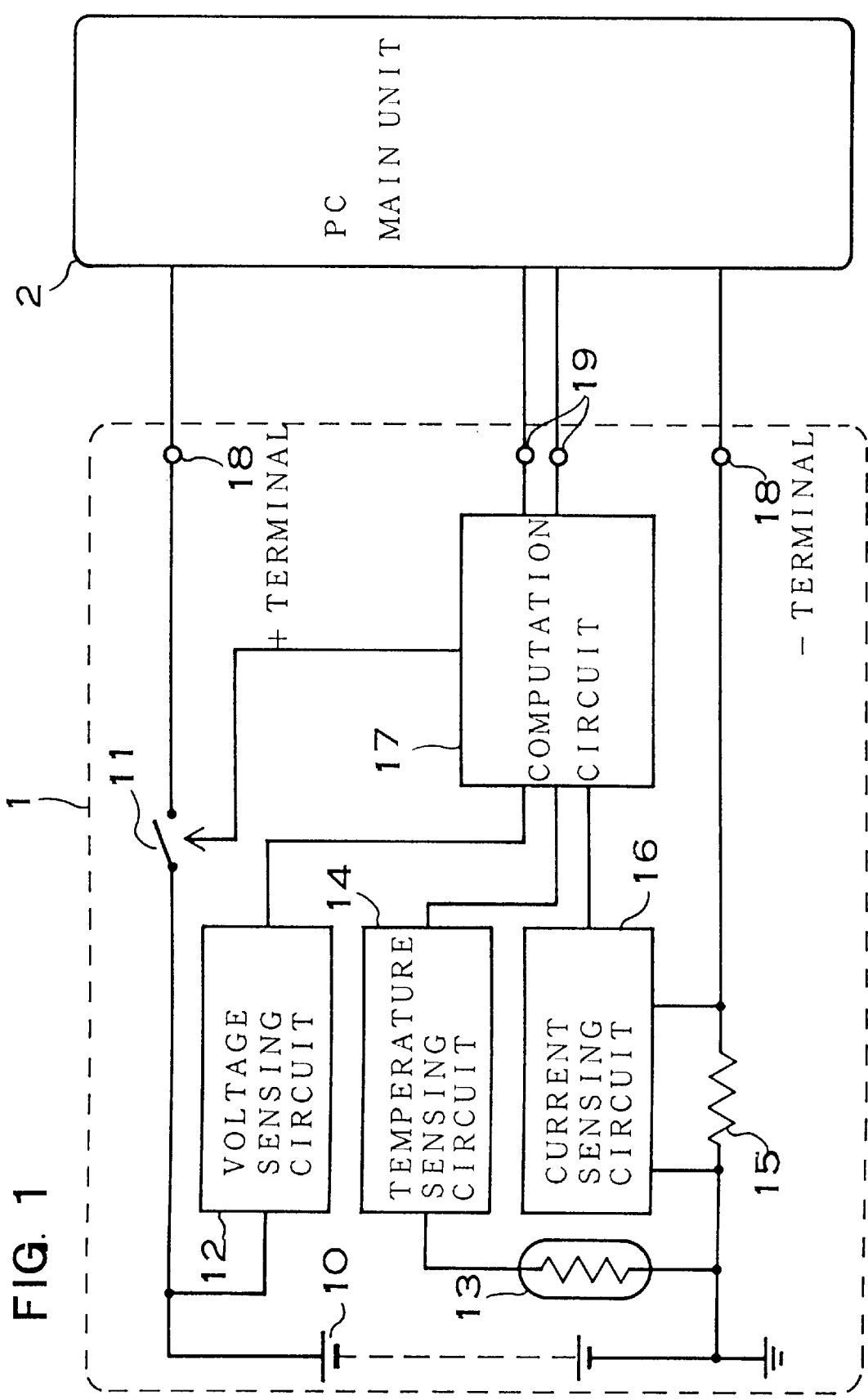
FIG. 1 is a block circuit diagram showing an embodiment of the present invention.

FIG. 1 shows a block circuit diagram of an embodiment of the present invention, including a battery pack 1, and a personal computer (PC) main unit 2. Here, the battery pack 1 is both mechanically and electrically attachable to, and detachable from the PC main unit 2.

The PC main unit 2 is provided with a charging circuit (not illustrated) for charging rechargeable batteries housed in the battery pack 1, and a display device for displaying remaining rechargeable battery capacity.

The battery pack 1 includes rechargeable batteries 10 such as nickel cadmium or nickel hydride batteries, a charge-discharge switch 11 inserted in the charge-discharge path of the rechargeable batteries 10, and a voltage sensing circuit 12 to measure rechargeable battery 10 voltage. In particular, the voltage sensing circuit 12 issues a detection signal when rechargeable battery 10 voltage reaches a first voltage V1 and a second voltage V2. Also the battery pack 1 includes a thermistor 13 thermally coupled to the rechargeable batteries 10, a temperature sensing circuit 14 to measure the temperature of the rechargeable batteries 10 based on output from the thermistor 13, a current sense resistor 15 connected in the charge-discharge path of the rechargeable batteries 10, a current sensing circuit 16 to measure charging current and discharging current based on output from the current sense resistor 15, and a computation circuit 17 to receive measurement signals from the voltage sensing circuit 12, the temperature sensing circuit 14, and the current sensing circuit 16, and perform various arithmetic processing and computation.

Specifically, the computation circuit 17 computes rechargeable battery 10 discharge capacity (the quantity of charge discharged from the batteries) by integrating the discharge current measured by the current sensing circuit 16. The computation circuit 17 also computes rechargeable battery 10 remaining battery capacity by subtracting the computed discharge capacity from the battery charge capacity. Further, the computation circuit 17 corrects the computed remaining battery capacity with previously established first remaining battery capacity Ya1 and second remaining battery capacity Ya2 values corresponding to the first voltage V1 and the second voltage V2 when measurement signals are received from the voltage sensing circuit 12 at those voltages.

Still further, the computation circuit 17 compares the difference between the computed remaining battery capacity at the point where battery voltage reaches the first voltage V1 and at the point where battery voltage reaches the second voltage V2 with the difference between the previously established first remaining battery capacity Ya1 and the second remaining battery capacity Ya2 corresponding to the first and second voltages V1 and V2. The computation circuit 17 adjusts the first voltage V1 to make these two remaining battery capacity differences equal.

In FIG. 1, the battery pack 1 is provided with the charge-discharge terminals 18 and the communication terminals 19 between the computation circuit 17 and the PC main unit 2. For example, data related to rechargeable battery 10 remaining battery capacity computed by the computation circuit 17 are sent to the PC main unit 2 via the communication terminals 19.

Operation of the present invention is described in detail as follows. The battery pack 1 is attached to the PC main unit 2 and rechargeable battery 10 charging is performed by supply of charging current through the charge-discharge terminals 18. At this time, rechargeable battery 10 charge capacity is computed by the computation circuit 17 which integrates the charging current measured by the current sense resistor 15 and the current sensing circuit 16. Meanwhile, rechargeable battery 10 voltage is measured by the voltage sensing circuit 12, and determination is made whether or not full battery charge has been reached based on the measured voltages. The computation circuit 17 stores in memory the integrated charge capacity up to the point where full battery charge is detected as the rechargeable battery 10 charge capacity.

Next, when the PC main unit 2 is operated, the rechargeable batteries 10 are discharged, and discharge current is supplied to the PC main unit 2 through the charge-discharge terminals 18. The computation circuit 17 integrates discharge current measured by the current sense resistor 15 and the current sensing circuit 16 to compute discharge capacity. This discharge capacity is subtracted from the rechargeable battery 10 charge capacity stored in memory as described above to compute the remaining battery capacity. The computed remaining battery capacity is successively transmitted to the PC main unit 2 via the communication terminals 19.

At the same time these remaining battery capacity computations are made, rechargeable battery 10 voltage is measured by the voltage sensing circuit 12. When the voltage sensing circuit 12 measures rechargeable battery 10 voltage at the first voltage V1 and at the second voltage V2 (V1>V2), the computation circuit 17 revises respective computed remaining battery capacity values according to the previously established first remaining battery capacity Ya1 (10% to 8%) and second remaining battery capacity Ya2 (5% to 3%) corresponding to the first and second voltages V1 and V2.

Specifically, if we assume the first remaining battery capacity Ya1 is set at 8% and the computed remaining battery capacity becomes 9%, the remaining battery capacity is maintained at 9% until rechargeable battery 10 voltage drops to the first voltage V1. On the other hand, if rechargeable battery 10 voltage drops to the first voltage V1 while the computed remaining battery capacity is greater than 9%, the computation circuit 17 revises the computed remaining battery capacity value to 8% when the first voltage V1 is reached.

In this manner, by correcting the remaining battery capacity determined by computation with the previously established first remaining battery capacity Ya1 and second remaining battery capacity Ya2 corresponding to the first and second voltages V1 and V2, the computation circuit 17 generates an accurate remaining battery capacity for the rechargeable batteries 10 during the period at the end of discharge.

Incidentally, as previously mentioned with reference to FIG. 2, the rechargeable battery 10 voltage characteristic curve during battery discharge drops as the number of charge-discharge cycles increases. For this reason, if the remaining battery capacity is always corrected to a the previously established remaining battery capacity (for example, Ya1) corresponding to a specified voltage (the first voltage V1 in this case), large errors will result as the number of rechargeable battery charge-discharge cycles increases. To prevent generation of these large errors, the value of the first voltage V1 is modified in the present invention. Specifically, the difference ($\Delta 1$) between the remaining battery capacity values computed at the points where the voltage sensing circuit 12 measures the first voltage V1 and the second voltage V2, that is the difference between the remaining battery capacity values Yb1 and Yb2 shown in FIG. 2 (or the difference between discharge capacity computed at the first and second voltages V1 and V2), is compared with the difference ($\Delta 2$) between the previously established first remaining battery capacity Ya1 and second remaining battery capacity Ya2. Then, the next time the rechargeable batteries 10 are discharged, the first voltage V1 is modified to make those two differences equal (in the case of FIG. 2, the first voltage V1 is reduced).

If we assume the first voltage prior to modification is V1', then the first voltage V1 is modified according to the following equation. Here, k is an appropriate coefficient smaller than 1.

$$V1 = V1' - (\Delta - \Delta 2) \times k$$

As a result of this voltage adjustment, accurate remaining battery capacity can be computed for the rechargeable batteries 10 independent of the number charge-discharge cycles they have been subjected to.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims or equivalence of such meets and bounds thereof are therefore intended to be embraced by the claims.

What is claimed is:

1. A method to determine remaining capacity of a rechargeable battery, comprising:
    (1) a step to integrate rechargeable battery discharge current;
    (2) a step to subtract the integrated discharge current from the charge capacity of the rechargeable battery to compute remaining battery capacity;
    (3) a step to measure rechargeable battery voltage;
    (4) a step to correct respective computed remaining battery capacity values when battery voltage reaches a first voltage and a lower second voltage, with a previously established first remaining battery capacity and a second remaining battery capacity corresponding to those voltages;
    (5) a step to compare the difference between the computed remaining battery capacity values at the point the first voltage is reached and at the point the second voltage is reached, with the difference between said first remaining battery capacity and said second remaining battery capacity; and
    (6) a step to modify the first voltage to make the two said differences equal.

2. A method to determine remaining capacity of a rechargeable battery as cited in claim 1 wherein the rechargeable battery is either a nickel cadmium battery or a nickel hydride battery.

3. A method to determine remaining capacity of a rechargeable battery as cited in claim 1 wherein the charge capacity for fully charging the rechargeable battery is taken to be the charge capacity of the rechargeable battery.

4. A method to determine remaining capacity of a rechargeable battery as cited in claim 1 wherein the previously established first remaining battery capacity is 10% to 8%, and the second remaining battery capacity is 5% to 3%.

5. A method to determine remaining capacity of a rechargeable battery as cited in claim 1 wherein the difference in calculated remaining battery capacity for rechargeable battery discharge from the first voltage to the second voltage is Δ1, the difference between the previously established first remaining battery capacity and second remaining battery capacity is Δ2, the first voltage before modification is V1', the first voltage after modification is V1, k is a constant, and the first voltage after modification is given by the following equation:

$$V1 = V1' - (\Delta 1 - \Delta 2) \times k.$$

6. A method to determine remaining capacity of a rechargeable battery, comprising:
    (1) a step to integrate rechargeable battery discharge current and compute discharge capacity;
    (2) a step to subtract this discharge capacity from the charge capacity of the rechargeable battery to compute remaining battery capacity;
    (3) a step to measure rechargeable battery voltage;
    (4) a step to correct respective computed remaining battery capacity values when battery voltage reaches a first voltage and a lower second voltage, with a previously established first remaining battery capacity and a second remaining battery capacity corresponding to those voltages;
    (5) a step to compare the difference between the computed discharge capacity values at the point the first voltage is reached and at the point the second voltage is reached, with the difference between said first remaining battery capacity and said second remaining battery capacity; and
    (6) a step to modify the first voltage to make the two said differences equal.

7. A method to determine remaining capacity of a rechargeable battery as cited in claim 6 wherein the rechargeable battery is either a nickel cadmium battery or a nickel hydride battery.

8. A method to determine remaining capacity of a rechargeable battery as cited in claim 6 wherein the charge capacity for fully charging the rechargeable battery is taken to be the charge capacity of the rechargeable battery.

9. A method to determine remaining capacity of a rechargeable battery as cited in claim 6 wherein the previously established first remaining battery capacity is 10% to 8%, and the second remaining battery capacity is 5% to 3%.

10. A method to determine remaining capacity of a rechargeable battery as cited in claim 6 wherein the difference in calculated discharge capacity for rechargeable battery discharge from the first voltage to the second voltage is Δ1, the difference between the previously established first remaining battery capacity and second remaining battery capacity is Δ2, the first voltage before modification is V1', the first voltage after modification is V1, k is a constant, and the first voltage after modification is given by the following equation:

$$V1 = V1' - (\Delta 1 - \Delta 2) \times k.$$

* * * * *